United States Patent [19]

Sakai et al.

[11] 4,194,166

[45] Mar. 18, 1980

[54] DIFFERENTIAL AMPLIFIER WITH A CURRENT MIRROR CIRCUIT

[75] Inventors: Kazumasa Sakai; Hiroshi Watanuki, both of Tokyo, Japan

[73] Assignee: Trio Kabushiki Kaisha, Tokyo, Japan

[21] Appl. No.: 874,203

[22] Filed: Feb. 1, 1978

[30] Foreign Application Priority Data

Feb. 4, 1977 [JP] Japan .................................. 52-10730

[51] Int. Cl.$^2$ .............................................. H03F 3/45
[52] U.S. Cl. ..................................... 330/257; 330/288
[58] Field of Search ................................ 330/257, 288

[56] References Cited

U.S. PATENT DOCUMENTS 4,007,427  2/1977  Leidich ................................ 330/257

Primary Examiner—James B. Mullins
Attorney, Agent, or Firm—Gerald J. Ferguson, Jr.; Joseph J. Baker

[57] ABSTRACT

In a differential amplifier having a current mirror circuit, the improvement where the collectors of a pair of transistors comprising the current mirror circuit are respectively connected to the bases of a pair of transistors of polarity reverse that of the current mirror transistors, the collectors of the reversed polarity transistors are connected to a power supply, the emitters of the reversed polarity transistors are connected to corresponding active elements of the differential amplifier, and resistors are respectively connected between the bases and emitters of the reversed polarity transistors.

9 Claims, 3 Drawing Figures

DIFFERENTIAL AMPLIFIER WITH A CURRENT MIRROR CIRCUIT

REFERENCE TO RELATED APPLICATION

This application is related to an application entitled "Preamplifier Having Integrated Circuitry" filed by the present applicants on instant date herewith and assigned to the same assignee, the related application being incorporated herein by reference.

BACKGROUND OF THE INVENTION

This invention relates to a differential amplifier used as a first stage amplifier or the like of an amplifying device in which a current mirror circuit for increasing load impedance is employed.

Conventionally, this type of differential amplifier with a current mirror circuit is as shown in FIG. 1. 1 and 2 are field effect transistors (FET) with N channels comprising the differential amplifier. The gates are connected respectively to input terminals 3 and 4 and the sources are connected in common and then connected to terminal 6 through resistor 5. Terminal 6 may be connected to a constant current source. 7 and 8 are PNP-type transistors comprising the current mirror circuit. The emitters are connected to the power supply terminal 11 by way of resistors 9 and 10 respectively. The collectors are connected to the corresponding drains of FETs 1 and 2 and the bases are connected in common together with the collector of transistor 8. The connection point B of the collector of transistor 7 and the drain of FET 1 is connected to the base of PNP-type transistor 12 of the next stage. The emitter of this transistor 12 is connected to power supply terminal 11 by way of resistor 13 and the collector is connected to output terminal 14 as well as to the terminal 6 by way of resistor 15.

The conventional differential amplifier with a current mirror circuit is as described above. In such circuits, considerations are given to integration of the current mirror circuit with the next stage circuitry and other circuits into integrated circuitry (IC) while attaching the active elements (in this case FETs 1 and 2) on the outside of the differential amplifier to improve S/N and associated interchangeability, as discussed in the above-mentioned related application. In this case, the current flowing to the differential amplifier (current I₁ flowing to resistor 5) must be made variable to obtain the optimum value according to the type of active elements used.

However, in the case of the conventional differential amplifier with a current mirror circuit, when the current I₁ is made variable, the voltage drop at resistors 9 and 10 changes, and the voltage between A and B (A is one end of the power supply side of resistor 9) changes. When the voltage between A and B decreases to a value smaller than that of the voltage between C and D (C is one end of the power supply side of resistor 13, and D is the other end of the transistor side of resistor 13) plus approximately 0.6 V, transistor 12 becomes non-conductive, and the circuit of the next stage does not operate. On the other hand, the voltage between A and B sometimes increases. When the voltage between A and B increases, the working point of transistor 12 increases and the operation of transistor 12 becomes unstable. Thus, a differential amplifier with a current mirror circuit is greatly affected by resistors 9 and 10. Consequently more stringent specifications for resistors 9 and 10 are required. However, if resistors 9, 10 and 13 are converted into integrated circuitry, the specifications therefor become rather approximate.

SUMMARY OF THE INVENTION

This invention was made in view of the above-mentioned considerations and the object is to provide a differential amplifier with a current mirror circuit that can maintain the voltage practically constant even when the current flowing to the differential amplifier is variable, thus preventing the next stage circuit from becoming non-operational or the operation from becoming unstable. Moreover, due to the minimal effects of the resistors, their specifications can be relaxed.

Other objects and advantages of this invention will be apparent from a reading of the following specification and claims taken with the drawing.

DETAILED DESCRIPTION OF PREFERRED EMBODIMENTS

Figure 1:
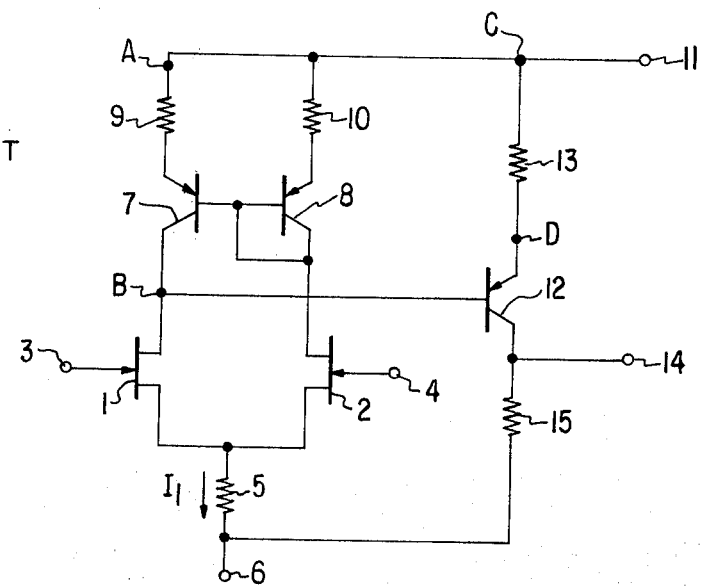
FIG. 1 is a circuit diagram of a conventional differential amplifier with a current mirror circuit.
Figure 2:
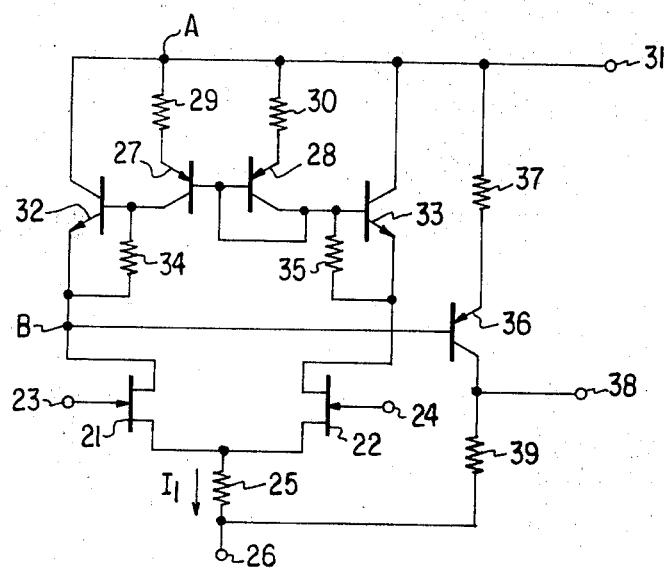
FIG. 2 is a circuit diagram of one illustrative embodiment of a differential amplifier with a current mirror circuit based on this invention.

In FIG. 2, 21 and 22 comprise a differential amplifier and are N channel FETs which are the active elements. The gates are connected respectively to input terminals 23 and 24 and the sources, after making a common connection, are connected to terminal 26 by way of resistor 25. Terminal 26 may be connected to a constant current source. 27 and 28 are PNP-type transistors comprising a current mirror circuit. The emitters are connected to power supply terminal 31 by way of resistors 29 and 30 respectively and the bases are commonly connected together with the collector of transistor 28. In this invention, the collectors of PNP-type transistors 27 and 28 comprising the current mirror circuit are connected to the bases of reversed polarity NPN-type transistors 32 and 33 respectively. The collectors of these reversed polarity transistors 32 and 33 are connected to the above-mentioned power supply terminal 31. The emitters are connected to the drains of corresponding FETs 21 and 22 of the differential amplifier. Resistors 34 and 35 are connected between the respective bases and emitters of reversed polarity transistors 32 and 33. The connection point B of the emitter of the reversed polarity transistor 32 and the drain of FET 21 is connected to the base of PNP-type transistor 36. The emitter of transistor 36 is connected to the power supply terminal 31 by way of resistor 37 and the collector is connected to the output terminal 38 as well as to terminal 26 by way of resistor 39.

The differential amplifier with a current mirror circuit of this invention is as above. In such a circuit, the main current flows through the reversed polarity transistors 32 and 33. Therefore, since a certain ratio is established between resistors 29 and 34, and resistors 30 and 35, the current flowing to resistor 29 remains practically unchanged even though the current I₁ flowing to the differential amplifier varies. Thus the voltage between A and B (A is at one end of the power supply side of resistor 29) can be maintained almost constant. Consequently, by using such a differential amplifier with a current mirror circuit, the voltage between A and B can be maintained almost constant even though the current I₁ is variable and transistor 36 (that is, the next stage circuit) can be prevented from becoming non-operational or the operation thereof becoming unstable. Since the voltage between A and B can be maintained almost constant, the effects of resistors 29 and 30 are minimal and the specifications of resistors 29 and 30 can be relaxed.

Figure 3:
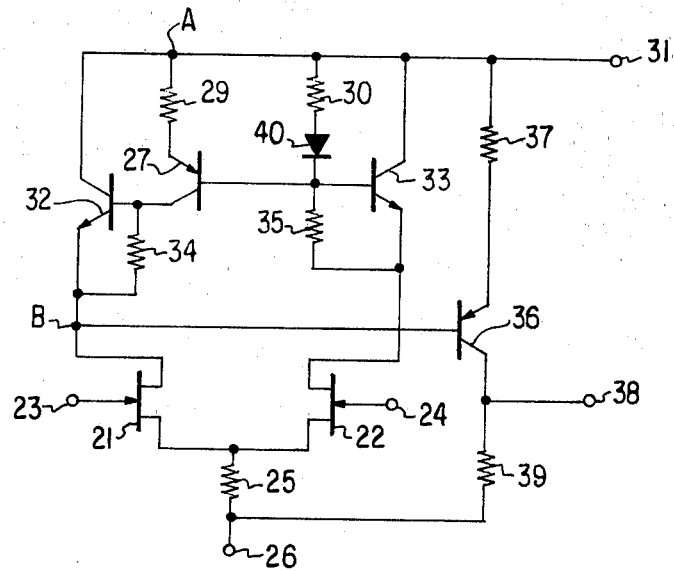
FIG. 3 is a circuit diagram of another illustrative embodiment of this invention.

In the above embodiment, the current mirror circuit consists of a pair of transistors 27 and 28. However, as shown in another embodiment in FIG. 3, one side can be replaced by a diode 40. In this case, the anode of diode 40 is connected to power supply terminal 31 by way of resistor 30, whereas the cathode is connected commonly with the base of transistor 27, the cathode also being connected to the base of reversed polarity transistor 33.

As described above in detail, a differential amplifier with a current mirror circuit that is very effective is provided in accordance with this invention.

What is claimed is:

1. In a differential amplifier with a current mirror circuit where said differential amplifier includes a pair of active elements having (a) control electrodes respectively connected to the input terminals of the differential amplifier, (b) first electrodes connected together, and (c) second electrodes, the improvement where the collectors of a pair of transistors comprising the current mirror circuit are respectively connected to the bases of a pair of transistors of polarity reverse that of the current mirror transistors, the collectors of the reversed polarity transistors are connected to a power supply, the emitters of the reversed polarity transistors are respectively connected to said second electrodes of the active elements of the differential amplifier, and resistors are respectively connected between the bases and emitters of the reversed polarity transistors.

2. A differential amplifier having a current mirror circuit, said amplifier comprising
a power supply,
a pair of active transistors having (a) control electrodes respectively connected to the input terminals of the differential amplifier, (b) first electrodes connected together and (c) second electrodes,
a pair of current mirror means where both have a first polarity and are connected to said power supply and where at least one of said current mirror means is a transistor and has (a) a control electrode, (b) a first electrode connected to said power supply and (c) a second electrode and the other current mirror means has at least a first electrode connected to said power supply and a second electrode,
a pair of reverse polarity transistors having a polarity opposite that of said first polarity where both the reverse polarity transistors include (a) control electrodes connected to the said second electrodes of said current mirror means, (b) second electrodes connected to said power supply and (c) first electrodes respectively connected to the second electrodes of said active transistors; and
a pair of resistor means connected respectively between the control electrodes and the first electrodes of said reverse polarity elements.

3. A differential amplifier as in claim 2 including an output transistor having a control electrode connected to the first electrode of the reverse polarity transistor whose control electrode is connected to the second electrode of the said one current mirror means.

4. A differential amplifier as in claim 2 where said other current mirror means is a transistor and has a control terminal connected to the control terminal of said one current mirror means.

5. A differential amplifier as in claim 2 where the other current mirror means is a diode, one end of which is connected to said control terminal of the said one current mirror means.

6. A differential amplifier as in claim 2 where said one current mirror means is a PNP transistor and the reverse polarity transistors are NPN transistors.

7. A differential amplifier as in claim 6 where said active transistors are N-type field effect transistors.

8. A differential amplifier as in claim 6 where the other current mirror means is a diode, the cathode of which is connected to the base of said PNP transistors.

9. In a differential amplifier with a current mirror circuit where said differential amplifier includes a pair of active elements having (a) control electrodes respectively connected to the input terminals of the differential amplifier, (b) first electrodes connected together, and (c) second electrodes, the improvement where the collector of a transistor and the cathode of a diode comprising the current mirror circuit are respectively connected to the bases of a pair of transistors of polarity reverse that of the current mirror transistor, the collectors of the reversed polarity transistors are connected to a power supply, the emitters of the reversed polarity transistors are respectively connected to said second electrodes of the active elements of the differential amplifier, and resistors are respectively connected between the bases and emitters of the reversed polarity transistors.

* * * * *